United States Patent [19]
Li

[11] Patent Number: 6,140,230
[45] Date of Patent: Oct. 31, 2000

[54] METHODS OF FORMING METAL NITRIDE AND SILICIDE STRUCTURES

[75] Inventor: Weimin Li, Boise, Id.

[73] Assignee: Micron Technology, Inc., Boise, Id.

[21] Appl. No.: 09/109,575

[22] Filed: Jul. 2, 1998

Related U.S. Application Data

[62] Division of application No. 09/026,405, Feb. 19, 1998, abandoned.

[51] Int. Cl.$^7$ ........................................................ A01L 21/44
[52] U.S. Cl. ........................ 438/653; 438/655; 438/656; 438/680; 438/683; 438/303; 438/664
[58] Field of Search ................................ 438/299–306, 438/653–656, 680, 682–683, 664, 627, 649, 651, 592

[56] References Cited

U.S. PATENT DOCUMENTS

| | | | |
|---|---|---|---|
| 4,676,866 | 6/1987 | Tang et al. | 156/643 |
| 4,914,500 | 4/1990 | Liu et al. | 257/384 |
| 5,221,853 | 6/1993 | Joshi et al. | 257/384 |
| 5,654,575 | 8/1997 | Jeng | 257/384 |
| 5,866,213 | 2/1999 | Foster et al. | 427/573 |
| 5,975,912 | 11/1999 | Hillman et al. | 438/680 |

OTHER PUBLICATIONS

Kamashida, et al., "Self–aligned TiN Formation by N2 Plasma Bias Treatment of TiSi2 Deposited by Selective Chemical Vapor Deposition," Jpn. J. Appl. Phys., vol. 36 (1977) pp. 642–647, Part 1, No. 2, Feb. 1997.

*Primary Examiner*—Charles Bowers
*Assistant Examiner*—Thanh Nguyen
*Attorney, Agent, or Firm*—Workman, Nydegger & Seeley

[57] ABSTRACT

The present invention relates to a method of forming a metal silicide layer upon an active area that is part of a junction in order to facilitate further miniaturization that is demanded and dictated by the need for smaller devices. A single PECVD process makes three distinct depositions. First, a metal silicide forms by the reaction: $MHal+Si+H_2 \rightarrow MSi_x + HHal$, where M represents a metal and Hal represents a preferred halogen or the like. Second, a metal nitride forms upon areas not containing Si by the reaction: $MHal+N_2+H_2 \rightarrow MN+HHal$. Third, a metal nitride forms upon areas of evolving metal silicide due to a diffusion barrier effect that makes formation of the metal silicide self limiting. Ultimately, a metal nitride layer will be uniformly disposed in a substantially uniform composition covering all underlying structures upon a semiconductor substrate.

45 Claims, 4 Drawing Sheets

METHODS OF FORMING METAL NITRIDE AND SILICIDE STRUCTURES

RELATED APPLICATION

This is a divisional patent application of U.S. patent application Ser. No. 09/026,405, filed on Feb. 19, 1998, now abandoned, entitled "METAL NITRIDE AND SILICIDE STRUCTURES AND METHODS OF FORMING SAME", which is incorporated herein by reference.

BACKGROUND OF THE INVENTION

1. The Field of the Invention

The present invention relates to fabrication of semiconductor structures. More particularly, the present invention relates to the formation of conductive and insulative layers in semiconductor structures. In particular, the present invention relates to the formation of metal silicide and nitride layers upon active areas on shallow junctions, upon gate structures, upon local interconnects, upon contacts, upon landing pads, and the like.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above. The term semiconductor substrate is contemplated to include such structures as silicon-on-insulator and silicon-on-sapphire.

In the microelectronics industry, the process of miniaturization entails the shrinking of individual semiconductor devices and crowding more semiconductor devices into a given unit area. With miniaturization, problems and complications incurred during processing lower the overall processing yield of the semiconductor devices. Each additional step required in the multiple processing steps increases the likelihood of individual mistakes upon a given wafer that, singularly or collectively, will cause a given microelectronic circuit to fail during testing or to fail unacceptably early in the field.

An example of multiple processing steps in the prior state of the art includes the formation of contacts to active areas in semiconductor devices. FIG. 1 illustrates a semiconductor structure 10 comprising a semiconductive substrate 12 that is exposed through an oxide 14. Within semiconductive substrate 12, an active area 16 is formed such as by N-doping within a P-well or vice-versa. The depth of active area 16 is illustrated as a junction 18. During the formation of interconnects, it has been a conventional practice to place a titanium layer 20 over semiconductor structure 10, as seen in FIG. 2, to assist with electrical connection and to prevent aluminum spiking into semiconductive substrate 12 through active area 16.

Titanium layer 20 of FIG. 2 is heat treated in the presence of nitrogen to form a TiN reaction layer 24 seen in FIG. 3. FIG. 3 depicts the prior art structure of FIG. 2 after several subsequent processing steps that follow deposition of titanium layer 20. Alternatively, formation of a TiN layer may be carried out by nitrogen implantation into Ti layer 20. Optionally, further formation of TiN reaction layer 24 may be carried out by thermal processing of the implanted nitrogen.

During the heat treatment, a $TiSi_2$ reaction layer 22, seen in FIG. 3, is formed by reaction of titanium layer 20 with the silicon within active area 16. Immediately above $TiSi_2$ reaction layer 22, there remains a portion of unreacted titanium 26 as the residue of titanium layer 20. Thermal processing also causes upper portions of titanium layer 20, as depicted in FIG. 2, to form TiN reaction layer 24. A metallization layer 28 is deposited upon TiN reaction layer 24 within a recess in oxide 14 where the recess terminates at active area 16.

In the formation of semiconductor structures such as a static random access memory (SRAM) structure, it is necessary to isolate individual components and to interconnect others, for example by etching through metallization layer 28, TiN reaction layer 24, and titanium layer 20. Because of the different chemical qualities of each of the aforementioned layers, the etch chemistry may require several individual etch recipes and processing steps.

Etching is illustrated as having been carried out in FIG. 3 upon semiconductor structure 10 whereby a patterning mask 30 has been formed and patterned upon metallization layer 28, and whereby the formation of a breach 42 has been accomplished by several etching steps.

FIG. 4 is an elevational cross-section detail of a portion of semiconductor structure 10 depicted in FIG. 3 taken alone the 4—4 section line, wherein it can be seen that patterning of metallization layer 28 results in an undercut 44 beneath TiN reaction layer 24 into unreacted Ti 26. Undercut 44 is caused by the requirement of multiple etch recipes in order to form breach 42, and by the nature of unreacted Ti 26 which etches significantly faster than TiN reaction layer 24. It can be seen in FIG. 4 that undercut 44 is formed within semiconductor structure 10 above oxide 14. Undercut 44 of TiN reaction layer 24 into unreacted Ti 26 can cause the collapse of structures that are superficial thereto, unwanted shorting, lift off, and other problems.

In addition to the possibility of the formation of undercut 44, the chemical composition of TiN reaction layer 24 contains a titanium-nitrogen gradient. The gradient of TiN reaction layer 24 begins with a lower surface 46 that is rich in titanium ("Ti-rich") and ends with an upper surface 48 that has less titanium therein ("Ti-lean"). Thus, the etch recipe for TiN reaction layer 24 must be selected to be broad enough to etch through lower surface 46 after etching through upper surface 48. In some cases, substantially complete etching of TiN reaction layer 24 would be required to be carried out by at least two etches to accommodate Ti-rich lower surface 46 and Ti-lean upper surface 48.

An additional problem that occurs by this prior art method is the possibility of formation of excessive amounts of $TiSi_2$ reaction layer 22 within the region of active area 16. A thermal process will be carried out to cause some or all of the titanium within titanium layer 20 upon active area 16 to form $TiSi_2$. If titanium layer 20 is deposited in excess, $TiSi_2$ reaction layer 22 could expand entirely through junction 18, thereby destroying it. Where titanium layer 20 is deposited in excess, a process engineer may choose to thermally treat semiconductor structure 10 for a limited time period. The limited time period will allow for a desired amount of titanium layer 20 and active area 16 to form $TiSi_2$. The process window for such an achievement may be too narrow to avoid undesirable results. The process engineer must thus balance a proper amount of deposition of titanium layer 20 against the thermal budget for the fabrication processing. Also, the process engineer must balance formation of $TiSi_2$ reaction layer 22 with the thermal budget and other activities such as annealing of dopants within active area 16. Finally, the process engineer that uses the prior art technique must balance thermal processing with potentially multiple and varied etch recipes in order to form breach 42 without the formation of undercut 44.

What is needed in the art is a method that overcomes the problems in the prior art, including a method of forming a $TiSi_2$ reaction layer that overcomes the problem of excessive $TiSi_2$ formation from a titanium layer that could potentially consume an active area so as to cause junction defects or defects in other structures.

What is also needed in the art is a method of forming a $TiSi_2$ reaction layer that avoids the possibility of a multiple, complicated, and broad etch that is required to remove a TiN reaction layer that comprises a Ti concentration gradient, and to remove an unreacted Ti layer without the destructive effects of undercutting.

What is also needed in the art is a method of forming a $TiSi_2$ conversion layer that avoids the problem of undercutting a TiN reaction layer into unreacted titanium.

SUMMARY OF THE INVENTION

The present invention relates to a method of forming a metal silicide layer upon an active area that is part of a junction in order to facilitate further miniaturization that is demanded and dictated by the need for smaller devices and that avoids the structure and processing problems of the prior art.

In general, the present invention contemplates a chemical vapor deposition (CVD) process. Preferably, the deposition is a single plasma enhanced chemical vapor deposition (PECVD) process having three depositions. First, a metal silicide forms in the general form set forth as: $MHal+Si+H_2 \rightarrow MSi_x+HHal$, where M represents a refractory or other preferred metal and Hal represents a preferred halogen or the like. Second, a metal nitride forms upon areas not containing Si in the general form set forth as: $MHal+N_2+H_2 \rightarrow MN+HHal$. Third, a metal nitride forms upon areas of evolving metal silicide due to a diffusion barrier effect that makes formation of the metal silicide self limiting. Ultimately, a metal nitride layer will be uniformly disposed upon a semiconductor structure that covers all underlying structures.

A distinct advantage of the present invention relates to the inherent ability thereof to metallize a junction. In the prior art, thermal processing of a Ti layer posed a significant risk of consuming by reaction substantially all of an active area by a $TiSi_2$ formation reaction. Additionally, thermal processing has been used to anneal dislocation damages caused by implantation of appropriate dopants into the active area. In the present invention, the remaining amount of the thermal budget allows for substantially complete annealing of the active area and the simultaneously limiting formation of $TiSi_2$ from $TiSi_x$ due to the presence of a TiN limiting layer.

Because of the self-limiting nature of the formation of the $TiSi_x$ layer where additional titanium is desirable upon the active area to form $TiSi_2$, the CVD gas may be supplemented with the presence of silane ($SiH_4$) or the like.

PECVD temperature conditions may be varied depending upon the particular reactants being used. For the use of metal halides as the metal component that is used to form the metal silicide, a preferred PECVD temperature is in a lower range than that used in the prior art to form a Ti layer.

According to the present invention, a plasma enhanced chemical vapor deposition (PECVD) uses $TiCl_4$, $N_2$, $H_2$ and other gases including, but not limited to $SiH_4$, Ar, and He. Under PECVD conditions, and according to the present invention, a first embodiment of the present invention comprises the reaction of $TiCl_4$ with monocrystalline silicon and polysilicon in the presence of $H_2$ to form a $TiSi_x$ layer according to: $TiCl_4+Si+2H_2 \rightarrow TiSi_x+4HCl$. PECVD conditions using $TiCl_4$ allow for a lower temperature formation of the $TiSi_x$ layer than conditions of the prior art.

During formation of the $TiSi_x$ layer, both diffusion of Si from the active area toward reaction gases that include $TiCl_4$, and the diffusion of $TiCl_4$ through the evolving $TiSi_x$ layer are resisted due to the formation of the $TiSi_x$ layer. Because of the resistance of $TiCl_4$ diffusion downwardly through the evolving of $TiSi_x$ layer and because of the resistance of Si diffusion upwardly, the formation of the $TiSi_x$ layer is self limiting. The self-limiting quality of formation of the $TiSi_x$ layer creates the advantage of providing control as to the amount of $TiSi_2$ that will ultimately reside upon the active area.

Following the formation of the $TiSi_x$ layer, it is sometimes desirable to convert all Ti that is part of the $TiSi_x$ layer into $TiSi_2$. The conversion thereof may be carried out by standard heat treatments such as rapid thermal processing (RTP), annealing, or the like. Simultaneous to or following the formation of $TiSi_2$ out of the $TiSi_x$ layer, a metallization layer may be deposited upon the semiconductor structure.

Distinct advantages are exhibited by the method of the present invention, particularly in the formation of self-aligned silicide contacts under the conditions of PECVD.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

The present invention may be used to form a metal silicide layer upon an active area that is part of a junction in order to facilitate further miniaturization that is demanded and dictated by the need for smaller devices and that avoids the structure and processing problems of the prior art.

Figure 5:
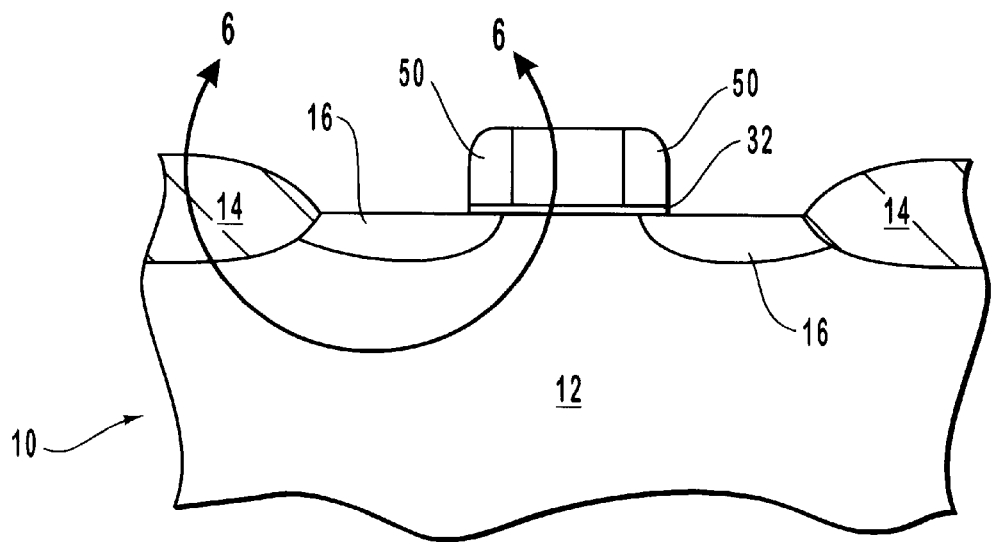
FIG. 5 is an elevational cross-section view of a semiconductor structure wherein two active areas are separated by a polysilicon stack and are isolated by respective field oxides.

FIG. 5 illustrates, by way of non-limiting example, semiconductor structure 10 that comprises two active areas 16 situated adjacent the sides of a polysilicon stack 34 that rests upon a gate oxide layer 32. Each active area 16 is isolated on a side that is opposite polysilicon stack 34 by a respective field oxide 14.

Figure 6:
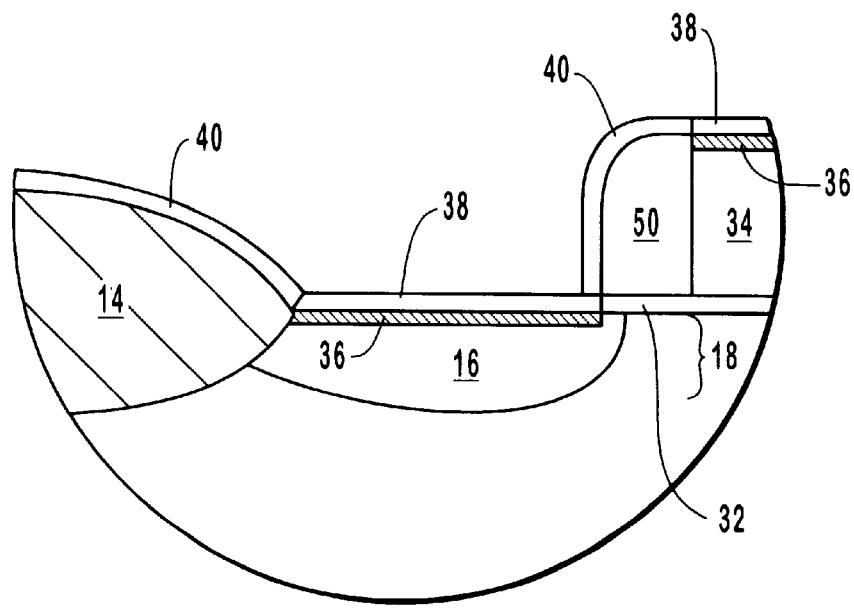
FIG. 6 is an elevational cross-section detail of the semiconductor structure depicted in FIG. 5 and taken along the 6—6 section line after further processing according to the method of the present invention, wherein a $TiSi_x$ layer has been formed within the active area, wherein a titanium nitride limiting layer is formed immediately adjacent to and above the titanium silicide layer, and wherein a titanium nitride layer is formed upon the adjacent structures.

The present invention makes use of a CVD process, preferably a PECVD process, with $TiCl_4$, $N_2$, $H_2$ and other gases including, but not limited to $SiH_4$, Ar, and He. A first embodiment of the present invention comprises the chemical reaction of $TiCl_4$ with monocrystalline silicon of active area 16 and polysilicon of polysilicon stack 34 in the presence of $H_2$ to form a $TiSi_x$ layer 36 as depicted in FIG. 6. The chemical reaction is represented as follows:

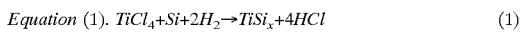

Equation (1). $TiCl_4 + Si + 2H_2 \rightarrow TiSi_x + 4HCl$ (1)

The deposition conditions using $TiCl_4$ allow for a lower temperature formation of $TiSi_x$ layer 36 than conditions of the prior art. $TiSi_x$ layer 36 is formed both within active area 16 and upon polysilicon stack 34. Where the lateral exposure of polysilicon stack 34 may be protected by a spacer 50, $TiSi_x$ layer 36 will only be grown within active area 16 and at a top surface of polysilicon stack 34. At this stage of the present invention, $TiSi_x$ layer 36 may not be substantially stoichiometric $TiSi_2$. During formation of $TiSi_x$ layer 36, there is a resistance to the diffusion of Si from active area 16 toward reaction gases that include $TiCl_4$, and a resistance to the diffusion of $TiCl_4$ through the evolving $TiSi_x$ layer 36. Because of the resistance of $TiCl_4$ diffusion downwardly through the evolving of $TiSi_x$ layer 36 and because of the resistance of Si diffusion upwardly, the formation of $TiSi_x$ layer 36 is self limiting.

Upon $TiSi_x$ layer 36, a TiN limiting layer 38 forms during the same PECVD process because formation of $TiSi_x$ layer 36 is self limiting. Additionally, a TiN layer 40 forms upon field oxide 14 and spacer 50, along with other exposed structures, due to the absence of any Si in those areas. The formation of TiN layer 40 upon field oxide 14 or upon spacer 50, which is less preferential than the formation of $TiSi_x$ layer 36, is carried out as follows:

Equation (2): $2TiCl_4 + N_2 + 4H_2 \rightarrow 2TiN + 8HCl$ (2)

The chemical reactions of Equation (1) and Equation (2) occur simultaneously upon semiconductor structure 10 under PECVD conditions of the present invention. Upon active area 16, the reaction of Equation (1) occurs preferentially over the CVD reaction of Equation (2). The self-limiting quality of the formation of $TiSi_x$ layer 36 creates the advantage of having a desirable degree of control upon the amount of $TiSi_2$ that will ultimately reside upon active area 16.

Once the diffusion of Si from active area 16 toward reaction gases that include $TiCl_4$ is substantially limited due to the formation of the $TiSi_x$ layer 36, the chemistry represented in Equation (2) occurs on the top of $TiSi_x$ layer 36 to form TiN limiting layer 38. Thus, TiN limiting layer 38 and TiN layer 40 together form a substantially continuous layer composed of TiN that covers semiconductor structure 10.

Formation of TiN according to the chemistry of Equation (2) provides a distinct advantage over the prior art in that the chemical composition of TiN limiting layer 38 and TiN layer 40 is substantially chemically homogenous through any cross-section taken thereof. By substantially chemically homogenous, it is required that either (1) the chemical composition of the titanium nitride, $Ti_yN$, has a composition where y is in a range from about 0.9 to about 1.1, preferably from about 0.99 to about 1.01, most preferably from about 0.999 to about 1.001, or (2) the composition, TiN, does not vary more than about 10% between any two given points, preferably not more than about 1%, and most preferably not more than about 0.1%. Optionally, both requirements for "substantially chemically homogenous" may be imposed. According to the second requirement, y may be number specific for a preferred application and metal chemistry, or y may vary according to the ranges of the first requirement.

Figure 1:
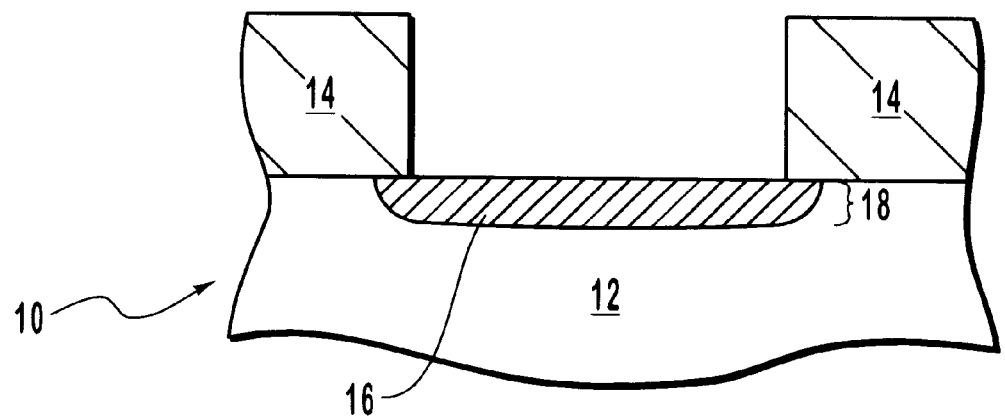
FIG. 1 is an elevational cross-section view of a semiconductor structure having an active area that has been exposed through an oxide layer.
Figure 2:
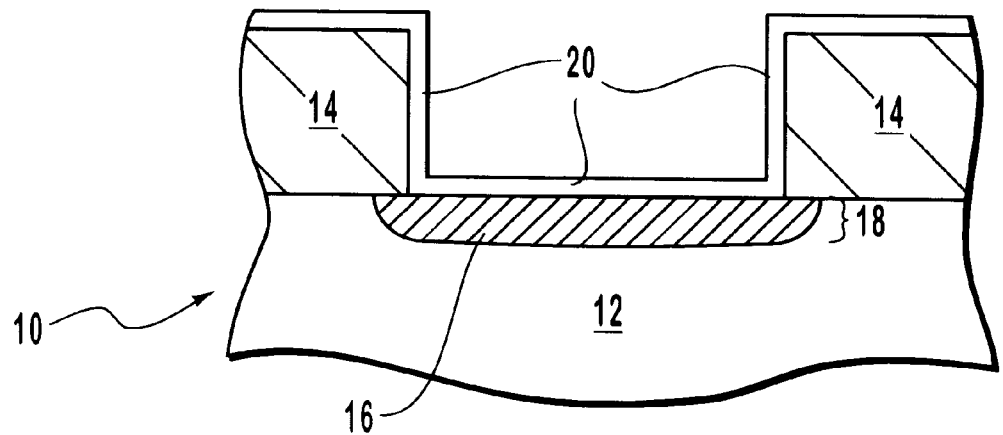
FIG. 2 is a prior art elevational cross-section view of the semiconductor structure depicted in FIG. 1 after deposition of a titanium layer upon the oxide layer and the active area.
Figure 3:
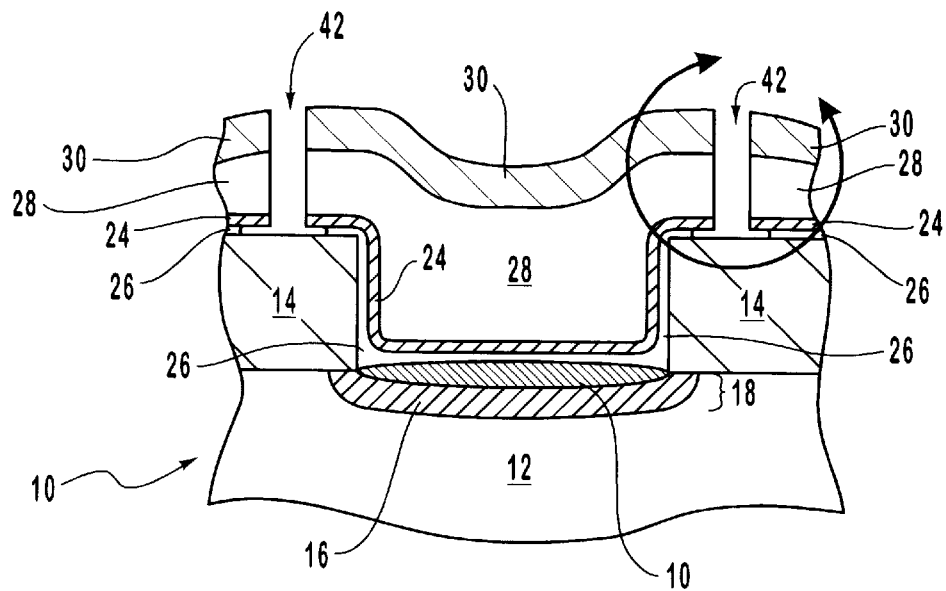
FIG. 3 is a prior art elevational cross-section view of the structure depicted in FIG. 2 after further processing, wherein the titanium layer has been thermally reacted with the active area in the presence of nitrogen to form a composite structure within the active area of titanium silicide, unreacted titanium, and thermally or ion-implantation produced titanium nitride. Upon the thermally or ion-implantation produced titanium nitride, a metallization layer has been deposited and patterned through use of a metallization patterning mask.
Figure 4:
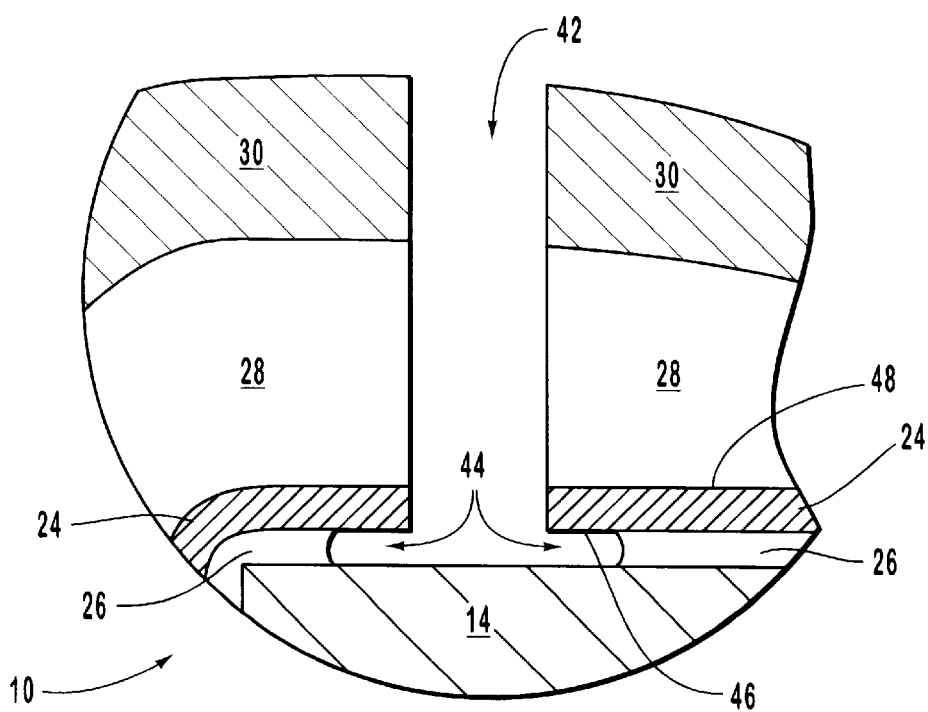
FIG. 4 is an elevational cross-section detail of a portion of the semiconductor structure according to the prior art as depicted in FIG. 3 and taken along the 4—4 section line, wherein it can be seen that patterning of the metallization layer has caused undercutting beneath the titanium nitride into the unreacted titanium.

Because the compositions of TiN limiting layer 38 and TiN layer 40 are substantially chemically homogenous, etching is simplified over the prior art wherein the etch recipe for TiN reaction layer 24, as seen in FIG. 4, was required to be broad enough to etch Ti-rich TiN 46 while also being able to begin the etch by etching Ti-lean TiN 48. Thus, the need for such versatility of the etch of TiN has been eliminated.

Another advantage of the present invention over that of the prior art is the substantial absence of Ti layer 20. During etching steps such as those illustrated in FIG. 4 of the prior art, the possibility of forming undercut 44 or other destructively dissimilar etch results is eliminated by the method of the present invention. Thus, the prior art problems of structure collapse, unintentional electrical disconnection, lift off, and the like are substantially avoided by the elimination of Ti layer 20 which had previously caused these problems during processing.

Figure 7:
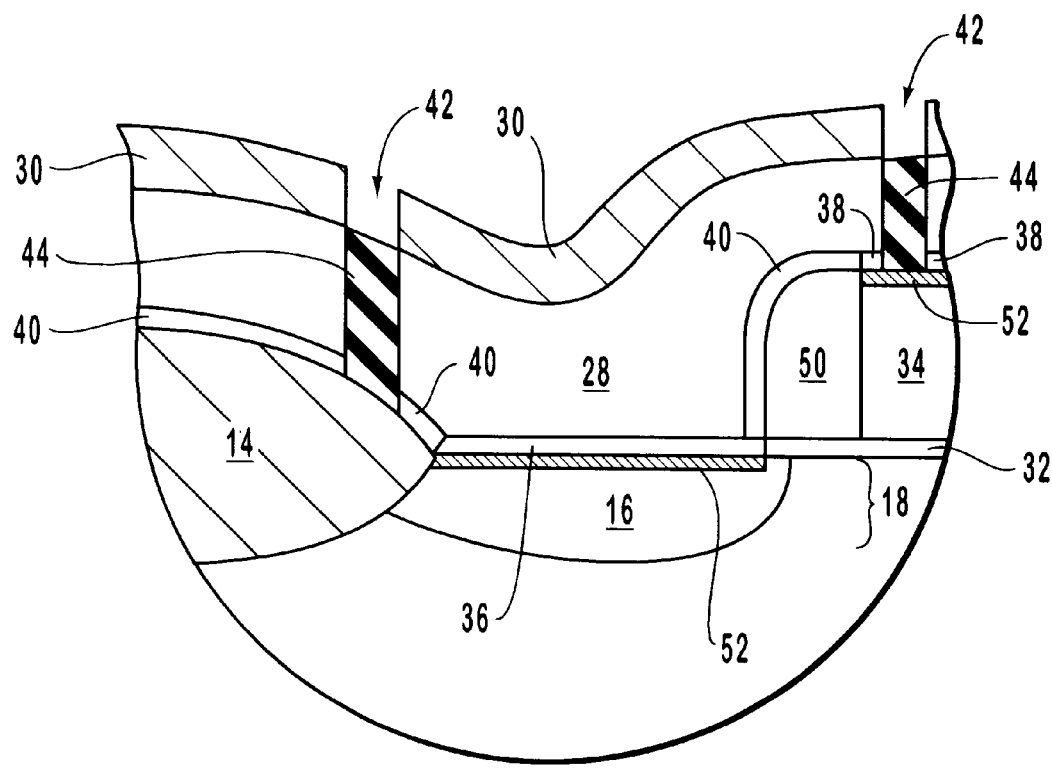
FIG. 7 is an elevational cross-section view of the semiconductor structure depicted in FIG. 6 after further processing according to the method of the present invention, wherein the $TiSi_x$ layer has been converted to a $TiSi_2$ conversion layer and wherein etched breaches have been formed.

Following the formation of $TiSi_x$ layer 36, it is sometimes desirable to convert $TiSi_x$ layer 36 into a $TiSi_2$ conversion layer 52 as seen in FIG. 7. The conversion thereof may be carried out by standard heat treatments such as rapid thermal processing (RTP), annealing, or the like as follows:

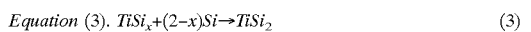

Equation (3). $TiSi_x + (2-x)Si \rightarrow TiSi_2$ (3)

Simultaneous to or following the formation of TiSi$_2$ conversion layer 52 from TiSi$_x$ layer 36, a metallization layer 28 may be formed by depositing upon semiconductor structure 10. Metallization layer 28 may be any suitable electrically conductive material including preferred metals such as aluminum, tungsten, tungsten silicide, or other metal silicides, or appropriately doped polysilicon.

Where semiconductor structure 10 is being fabricated to form an SRAM, appropriate etching through TiN limiting layer 38 and TiN layer 40 to isolate selected structures is carried out. Etching is carried out by formation of patterning mask 30 upon metallization layer 28, exposing and removing selected portions of patterning mask 30, and etching through metallization layer 28 and, where appropriate, through TiN limiting layer 38 and TiN layer 40. The CVD formation of both TiN limiting layer 38 and TiN layer 40 causes both to be substantially chemically homogeneous between the two and through any cross-section taken thereof of either of the two or both. As such, a single etch recipe may be selected. In the prior art, three etch recipes or more were required in order to accomplish an etch through metallization layer 28, TiN reaction layer 24, and unreacted Ti 26. In the present invention, any etch recipe that is sufficient to remove metallization layer 28 anisotropically and to remove either or both of TiN limiting layer 38 or TiN layer 40 is sufficient. Because TiN limiting layer 38 and or TiN layer 40 are substantially chemically uniform in any cross-section taken thereof, etching of these layers is substantially simplified.

Distinct advantages are exhibited by the method of the present invention particularly in the formation of self-aligned silicide contacts under the conditions of PECVD. All of group VIIIB metals react with Si at 600° C. or less, and, with the exception of Ti, there is no reaction of the metal with the masking material such as field oxide 14 during the silicide formation. When the silicides of the group VIIIB metals are formed at such low temperatures, the metal atoms diffuse into the Si active area 16 and react with it as set forth above.

Besides use of TiCl$_4$, of the group VIIIB metals, formation of CoSi$_2$ is of particular interest as an alternative embodiment of the present invention. The resistivity of CoSi$_2$ is substantially the same as that of TiSi$_2$. Silicides of platinum, palladium, and nickel are also of interest where a higher resistivity is allowed or required.

Metal silicides may be selected and formed from metals for specific useful applications in the present invention. A first preferred group of metals comprises Ti, Co, Sc, Y, Zr, La, Nd, and Hf. Ti, Co, and Sc are more preferred, and Ti is most preferred. A second preferred group of metals comprises Ni, Pt, Pd, Cu, Ag, Au, Rh, and Ir. Of these, Ni, Pt, and Pd are more preferred, and Ni is most preferred. A third preferred group of metals comprises W, Ta, and Nb. Of the members of the third preferred group, W is more preferred.

The source of metals for forming metal silicides is preferably accomplished with a first preferred halogen for forming a metal halide. The first preferred halogen is chlorine. A second preferred halogen for forming a metal halide is bromine. A third preferred halogen for forming a metal halide is iodine. Of the preferred halogens, chlorine is most preferred. Particularly preferred metal halogens include titanium chloride, nickel chloride, silver chloride, and scandium chloride.

In general, the present invention contemplates a PECVD process wherein three distinct depositions occur within a single PECVD operation. First, a metal silicide forms in the general form set forth as follows:

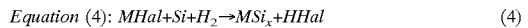

Equation (4): $MHal + Si + H_2 \rightarrow MSi_x + HHal$ \hfill (4)

In Equation (4), M represents a metal and Hal represents a preferred halogen or the like. Second, a metal nitride forms upon areas not containing monocrystalline silicon or polysilicon in the general form set forth as follows:

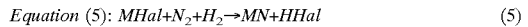

Equation (5): $MHal + N_2 + H_2 \rightarrow MN + HHal$ \hfill (5)

Third, a metal nitride forms upon areas of evolving metal silicide due to a diffusion barrier effect that makes formation of the metal silicide self limiting, according to Equation (5). Ultimately, metal nitride layers 38, 40 will be uniformly disposed upon semiconductor structure 10 so as to cover all underlying structures.

Another distinct advantage of the present invention relates to the ability thereof to a junction 18 seen in FIGS. 6–7. In the prior art, thermal processing of Ti layer 20 posed a significant risk of reacting substantially all of active area 16 with the titanium in Ti layer 20 and causing TiSi$_2$ reaction layer 22 to consume active area 16. In a preferred embodiment, junction 18 has a vertical cross sectional depth of about 200 nm, more preferably about 150 nm, and most preferably about 100 nm. TiSi$_2$ conversion layer 52 is about 50% of the total depth of junction 18, preferably about 20% of the total depth, more preferably about 10% of the total depth, and most preferably about 5% of the total depth of junction 18.

Additionally, thermal processing has been used to anneal dislocation damages caused by implantation of appropriate dopants into active area 16. In the prior art, it was required to balance substantially the proper annealing of active area 16 by the formation of TiSi$_2$ reaction layer 22 such that TiSi$_2$ reaction layer 22 did not substantially consume active area 16. In the present invention, the remaining amount of the thermal budget allows for substantially complete annealing of active area 16 and the simultaneously limiting formation of TiSi$_2$ conversion layer 52 from TiSi$_x$ due to the presence of TiN limiting layer 38.

Because of the self-limiting nature of the formation of TiSi$_x$ layer 36 where additional titanium is desirable to be formed upon active area 16 so as to form TiSi$_2$, the CVD gas may be supplemented with the presence of silane (SiH$_4$) or the like.

PECVD temperature conditions may be varied depending upon the particular reactants being used. For the use of metal halides as the metal component that is used to form the metal silicide, a preferred PECVD temperature is in the range from 300° C. to 800° C. For metal halides that only require a lower temperature range for PECVD to form the preferential metal silicide over forming the metal nitride, a temperature in the range from 300° C. to 600° C. is preferred. More preferred is a temperature range from 400° C. to 500° C. Most preferred is a temperature of about 450° C. For metal halides that require a higher processing temperature in order to accomplish the preferential formation of a metal silicide over forming a metal nitride, a temperature in the range from about 500° C. to about 800° C. is preferred. More preferably, a temperature in the range from about 600° C. to about 700° C. is selected, and most preferably at temperature of about 650° C. is selected. For the particular metal halide of TiCl$_4$, a preferred temperature is in the range from about 500° C.

to about 600° C., more preferably from about 525° C. to about 575° C., and most preferably about 550° C.

An example of the method of the present invention is set forth below. Semiconductor structure 10, as depicted in FIG. 5 is provided in preparation for the formation of an SRAM array. Semiconductor structure 10 is placed in a PECVD environment using $TiCl_4$, $N_2$ and $H_2$ in an appropriate carrier gas such as He, Ar or the like. Because of the plasma enhanced conditions of the CVD process, a CVD temperature in the range from about 500° C. to about 600° C., preferably 550° C., is established.

PECVD commences upon semiconductor structure 10 with two distinct chemistries as set forth in Equations (1) and (2). In this example, the metal halide comprises $TiCl_4$ and the formation of the metal nitride comprises the formation of TiN. Upon field oxide 14, the chemistry set forth in Equation (2) is carried out to form TiN layer 40. Upon active area 16, $TiSi_x$ layer 36 forms until diffusion of silicon upwardly and/or diffusion of titanium downwardly therethrough is substantially resisted. At this stage of the process, formation of $TiSi_x$ layer 36 is substantially discontinued and the formation of TiN limiting layer 38 forms concurrently with continued formation of TiN layer 40. Following the formation of sufficiently thick layers of TiN, thermal processing is carried out both to diffuse dopants within active area 16 if necessary and to substantially complete the conversion of $TiSi_x$ layer 36 to stoichiometric $TiSi_2$ according to Equation (3). Thus a $TiSi_2$ conversion layer 52 forms in a limited way from $TiSi_x$ layer 36.

Formation of metallization layer 28 in this example is next carried out by PVD or CVD of aluminum or the like to form metallization layer 28 as depicted in FIG. 7. Patterning mask 30 is deposited and patterned upon metallization layer 28. A single etch recipe is preferably chosen at this stage that will substantially anisotropically etch through metallization layer 28 and either of TiN limiting layer 38 and TiN layer 40 or both. The etch of TiN layer 40 will stop on field oxide 14. Additionally, the preferable single etch recipe is selected to have etch stop qualities upon a layer of $TiSi_2$ such as that of $TiSi_2$ conversion layer 52. Alternatively, a two-etch recipe etch scheme can be chosen such that metallization layer 28 is first anisotropically etched and the TiN of either of TiN limiting layer 38 and TiN layer 40 is removed in a second etch that may be either an anisotropic dry or isotropic wet etch.

As can be seen in FIG. 7, a substantially discrete region forming $TiSi_2$ conversion layer 52 is formed by the method of the present invention. Thermal processing of $TiSi_x$ layer 36 to form $TiSi_2$ conversion layer 52 may be carried out without concern of excessive titanium from titanium layer 20, as seen in the prior art, that is expanding its significantly through junction 18 of active area 16 to destroy by consumption the junction 18. Choosing a desired thickness of $TiSi_2$ conversion layer 52 can be accomplished by modifying conditions of the PECVD of the present invention depending upon the particular application that is desired.

The examples set forth herein demonstrate the formation of $TiSi_2$ conversion layer 52 from $TiSi_x$ 36 by use of a metal halide reactant in conjunction with hydrogen and nitrogen. The present invention may be carried out to form metal silicide layers upon semiconductor structures and has wide applicability in the formation of metal silicide structures that include the self-limiting quality of the formation of metal silicides, the ultimate resistance to silicon reactant diffusion, and the subsequent formation of metal nitrides that are substantially chemically uniform.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming a semiconductor structure comprising:
   providing a semiconductive substrate having an upper surface;
   forming a gate stack upon said semiconductor substrate;
   providing a chemical vapor deposition (CVD) comprising a metal halide, nitrogen, and hydrogen to form:
      a metal silicide layer within said upper surface by a reaction between said upper surface and said metal of said metal halide; and
      a metal nitride layer upon said metal silicide layer by a reaction between said metal halide and said nitrogen
   forming a metallization layer upon said metal nitride layer;
   patterning said metallization layer and said metal nitride layer to form a recess therein on opposite sides of said gate stack;
   filling said recess with a dielectric material to isolate gate stack.

2. A method of forming a semiconductor structure according to claim 1, wherein said metal silicide forms an evolving diffusion barrier to said metal halide toward said semiconductive substrate.

3. A method of forming a semiconductor structure according to claim 1, wherein said metal silicide forms an evolving diffusion barrier to said semiconductive substrate toward said metal halide.

4. A method of forming a semiconductor structure according to claim 1, wherein said CVD is carried out at a temperature range from about 300° C. to about 800° C.

5. A method of forming a semiconductor structure according to claim 1, wherein said CVD is carried out at a temperature range from about 400° C. to about 600° C.

6. A method of forming a semiconductor structure according to claim 1, wherein said CVD is carried out at a temperature range from about 600° C. to about 700° C.

7. A method of forming a semiconductor structure according to claim 1, wherein said CVD is carried out at a temperature range from about 500° C. to about 600° C.

8. A method of forming a semiconductor structure according to claim 1, wherein said metal halike is $TiCl_4$ and said temperature is in a range from about 500° C. to about 600° C.

9. A method of forming a semiconductor structure according to claim 1, wherein said CVD includes a silicon-containing gas.

10. A method of forming a semiconductor structure according to claim 1, wherein:
    said gate stack is composed of polysilicon; and
    providing a CVD forms said metal silicide upon the polysilicon of the gate stack.

11. A method of forming a semiconductor structure according to claim 1, further comprising:
    forming a substantially stoichiometric metal silicide from said metal silicide layer, said metal silicide in said metal silicide layer having a formula $MSi_x$ wherein x is in a range from about 1 to about 4.

12. A method of forming a semiconductor structure according to claim 1, wherein said upper surface comprises a junction, the method further comprising:

forming $TiSi_2$ from said $MSi_x$ within said junction.

13. A method of forming a semiconductor structure according to claim 1, wherein said metal from said metal halide is selected from the group consisting of Ti, Co, Sc, Y, Zr, La, Nd, and Hf.

14. A method of forming a semiconductor structure according to claim 1, wherein said metal of said metal halide is selected from the group consisting of Ti, Co, and Sc.

15. A method of forming a semiconductor structure according to claim 1, wherein said metal of said metal halide is Ti.

16. A method of forming a semiconductor structure according to claim 1, wherein said metal of said metal halide is selected from the group consisting of Ni, Pt, Pd, Cu, Ag, Au, Rh, and Ir.

17. A method of forming a semiconductor structure according to claim 1, wherein said metal of said metal halide is selected from the group consisting of Ni, Pt, and Pd.

18. A method of forming a semiconductor structure according to claim 1, wherein said metal of said metal halide is Ni.

19. A method of forming a semiconductor structure according to claim 1, wherein said metal of said metal halide is selected from the group consisting of W, Ta, and Nb.

20. A method of forming a semiconductor structure according to claim 1, wherein said metal of said metal halide is W.

21. A method of forming a semiconductor structure according to claim 1, wherein said halide of said metal halide is selected from the group consisting of F, Cl, Br, and I.

22. A method of forming a semiconductor structure according to claim 1, wherein said halide of said metal halide is Cl.

23. A method of forming a semiconductor structure comprising:

providing a semiconductive substrate having an junction therein;

forming a gate stack upon said semiconductor substrate and adjacent to said junction;

providing a chemical vapor deposition (CVD) at a temperature range from about 300° C. to about 800° C. and comprising a metal halide, a nitrogen gas, and a hydrogen gas, wherein:

said halide of said metal halide is selected from the group consisting of F, Cl, Br, and I; and a reaction between said junction and said metal of said metal halide forms a metal silicide layer within said junction; and a reaction between said metal halide and said nitrogen gas forms a metal nitride layer upon said metal silicide layer;

forming a metallization layer upon said metal nitride layer;

patterning said metallization layer and said metal nitride layer to form a recess therein; and filling said recess with a dielectric material.

24. A method of forming a semiconductor structure according to claim 23, wherein the gate stack is composed of polysilicon; and providing a CVD causes a reaction between the polysilicon of the gate stack and the metal of said metal halide to form a metal silicide upon the gate stack.

25. A method of forming a semiconductor structure according to claim 23, wherein said metal of said metal halide is selected from the group consisting of Ti, Co, and Sc.

26. A method of forming a semiconductor structure according to claim 23, wherein said metal of said metal halide is selected from the group consisting of Ni, Pt, and Pd.

27. A method of forming a semiconductor structure according to claim 23, wherein said metal of said metal halide is selected from the group consisting of W, Ta, and Nb.

28. A method of forming a semiconductor structure according to claim 23, further comprising:

forming a substantially stoichiometric metal silicide from said metal silicide layer, said metal silicide in said metal silicide layer having a formula $MSi_x$ wherein x is in a range from about 1 to about 4.

29. A method of forming a semiconductor structure according to claim 23, wherein said upper surface comprises a junction, the method further comprising:

forming $TiSi_2$ from said $MSi_x$ within said junction.

30. A method of forming a semiconductor structure according to claim 23, wherein said CVD is a plasma enhanced chemical vapor deposition.

31. A method of forming a semiconductor structure comprising:

providing a semiconductive substrate having an junction therein;

forming a gate stack upon said semiconductor substrate and adjacent to said junction;

providing a plasma enhanced chemical vapor deposition in a temperature range from about 300° C. to about 800° C. and comprising a metal halide, a nitrogen gas, and a hydrogen gas, wherein:

said metal of said metal halide is selected from the group consisting of Ti, Ni, and W;

said halide of said metal halide is selected from the group consisting of F, Cl, Br, and I; and a reaction between said junction and said metal of said metal halide forms a metal silicide layer within said junction; and a reaction between said metal halide and said nitrogen gas forms a metal nitride layer upon said metal silicide layer;

forming a metallization layer upon said metal nitride layer;

patterning said metallization layer and said metal nitride layer to form a recess therein; and filling said recess with a dielectric material.

32. A method of forming a semiconductor structure comprising:

providing a semiconductive substrate having a first exposed silicon surface, and having a feature projecting from said semiconductor substrate adjacent to said first exposed silicon surface, said feature having thereon a second exposed silicon surface; and performing a PECVD in a temperature range from about 500° C. to about 600° C. and comprising $TiCl_4$, $N_2$, $H_2$, and a carrier gas to form:

a $TiSi_x$ film within said first exposed silicon surface and upon said second exposed silicon surface; and a TiN film upon and between said first and second exposed silicon surfaces;

forming a metallization film upon the TiN film; and etching through the metallization film and the TiN film to expose;

the first exposed silicon surface; and
the second exposed silicon surface;

forming a dielectric material upon the first and second exposed silicon surfaces.

33. A method of forming a semiconductor structure according to claim 32, further comprising:
forming a junction within said first exposed silicon surface.

34. A method of forming a semiconductor structure according to claim 33, further comprising:
forming $TiSi_2$ from said $TiSi_x$ film in said junction at said first exposed silicon surface, whereby said $TiSi_2$ comprises about 50% of the depth of said junction.

35. A method of forming a semiconductor structure according to claim 34, wherein said $TiSi_2$ comprises about 20% of the depth of said junction.

36. A method of forming a semiconductor structure according to claim 34, wherein said $TiSi_2$ comprises about 10% of the depth of said junction.

37. A method of forming a semiconductor structure according to claim 32, wherein the TiN of the TiN film:
upon the first exposed silicon surface;
upon the second exposed silicon surface; and
upon the feature and between the first and second exposed silicon surfaces have substantially the same TiN composition.

38. A method of forming a semiconductor structure according to claim 32, wherein the feature is composed of polysilicon and has a spacer situated thereon between the first and second exposed silicon surfaces.

39. A method of forming a semiconductor structure according to claim 32, wherein etching through the metallization film and the TiN film comprises a first anisotropic dry etch that stops upon said feature and upon said $TiSi_x$.

40. A method of forming a semiconductor structure according to claim 32, wherein etching through the metallization film and the TiN film, comprises a first anisotropic dry etch that stops upon said TiN film, and a second etch that stops upon said feature and upon said $TiSi_x$.

41. A method of forming a semiconductor structure according to claim 32, wherein said feature is a gate stack having a spacer on a lateral surface thereof.

42. A method of forming a semiconductor structure according to claim 32, wherein etching through the metallization film and the TiN film comprises a first anisotropic dry etch that stops upon said feature.

43. A method of forming a semiconductor structure according to claim 32, wherein etching through the metallization film and the TiN film comprises a first anisotropic dry etch that stops upon said TiN film and a second etch that stops upon said feature.

44. A method of forming a semiconductor structure comprising:
providing a semiconductive substrate having a first exposed silicon surface;

forming adjacent to said exposed first silicon surface:
a gate stack having a second exposed silicon surface thereon;
a spacer upon the gate stack between the first and second exposed silicon surfaces; and
a field oxide region;

forming a junction within said exposed first silicon surface;

forming:
a $TiSi_x$ film within said first and second exposed silicon surfaces; and
a TiN film upon:
the field oxide region;
the spacer; and
the first and second exposed silicon surfaces;

forming a metallization film upon the TiN film;

forming a recess through the metallization film and the TiN film to expose:
the field oxide region;
the first exposed silicon surface; and
the second exposed silicon surface;

forming a dielectric material upon:
the field oxide region;
the first exposed silicon surface; and
the second exposed silicon surface.

45. A method of forming a semiconductor structure comprising:
forming a semiconductive substrate having an electrically active region therein;

forming a field oxide region in the semiconductive substrate that is adjacent to the electrically active region;

forming a raised structure projecting from said semiconductive substrate adjacent to said electrically active region;

forming a metal silicide upon said electrically active region and upon the raised structure;

forming a metal nitride layer extending continuously from the field oxide, upon the metal silicide on the electrically active region, to make contact with the metal silicide upon the raised structure;

forming a metallization material extending continuously upon said metal nitride layer over the field oxide region, the electrically active region, and the raised structure;

forming a first dielectric material projecting from the field oxide region in contact with the metal nitride layer and the metalization material; and forming a second dielectric material projecting from the metal silicide upon the raised structure and being in contact with the metal nitride layer upon the raised structure, and being in contact with the metalization material.

* * * * *

UNITED STATES PATENT AND TRADEMARK OFFICE
CERTIFICATE OF CORRECTION

PATENT NO. : 6,140,230
DATED : October 31, 2000
INVENTOR(S) : Weimin Li

It is certified that error appears in the above-identified patent and that said Letters Patent is hereby corrected as shown below:

Title page,
In OTHER PUBLICATIONS, insert -- Wolf "Silicon Processing for the VLSI Era" vol. 1, pages 539-542 (1986) --

Column 1,
Line 8, after "FORMING SAME"" change "." to -- , --
Line 56, after "illustrated as" change "ajunction" to -- a junction --

Column 4,
Line 3, after "limited to" insert -- , --

Column 5,
Line 44, after "limited to" insert -- , --

Column 7,
Line 14, after "mask 30," delete "and"

Column 9,
Lines 35, and 42, after "layer 38" change "and" to -- or --
Line 50, after "expanding" change "its" to -- it --

Signed and Sealed this

Fourth Day of December, 2001

*Attest:*

NICHOLAS P. GODICI
*Attesting Officer*  *Acting Director of the United States Patent and Trademark Office*